(12) United States Patent
Dimitrakopoulos et al.

(10) Patent No.: US 7,977,032 B2
(45) Date of Patent: Jul. 12, 2011

(54) METHOD TO CREATE REGION SPECIFIC EXPOSURE IN A LAYER

(75) Inventors: Christos D. Dimitrakopoulos, Somers, NY (US); Daniel C. Edelstein, White Plains, NY (US); Vincent J. McGahay, Poughkeepsie, NY (US); Satyanarayana V. Nitta, Poughquag, NY (US); Kevin S. Petrarca, Newburgh, NY (US); Shom Ponoth, Fishkill, NY (US); Shahab Siddiqui, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 1036 days.

(21) Appl. No.: 10/906,268

(22) Filed: Feb. 11, 2005

(65) Prior Publication Data

US 2006/0183062 A1 Aug. 17, 2006

(51) Int. Cl.
*G03F 7/20* (2006.01)
(52) U.S. Cl. ........................................ 430/311; 430/394
(58) Field of Classification Search .................. 430/394, 430/5, 311
See application file for complete search history.

(56) References Cited

U.S. PATENT DOCUMENTS

| 4,665,007 | A * | 5/1987 | Cservak et al. | 430/311 |
| 5,489,556 | A * | 2/1996 | Li et al. | 438/53 |
| 5,792,706 | A | 8/1998 | Michael et al. | |
| 6,174,775 | B1 * | 1/2001 | Liaw | 438/283 |
| 6,228,770 | B1 * | 5/2001 | Pradeep et al. | 438/692 |
| 6,423,629 | B1 * | 7/2002 | Ahn et al. | 438/622 |
| 6,462,817 | B1 * | 10/2002 | Strocchia-Rivera | 356/369 |
| 6,987,059 | B1 | 1/2006 | Burke et al. | |
| 7,041,571 | B2 | 5/2006 | Strane | |
| 2002/0001777 | A1 * | 1/2002 | Kido | 430/313 |
| 2003/0180627 | A1 * | 9/2003 | Lavallee et al. | 430/5 |
| 2004/0175848 | A1 * | 9/2004 | Chen et al. | 438/3 |
| 2004/0175957 | A1 * | 9/2004 | Lukas et al. | 438/778 |
| 2005/0064343 | A1 * | 3/2005 | Romanato et al. | 430/312 |
| 2005/0087516 | A1 * | 4/2005 | Duerksen et al. | 216/62 |
| 2005/0151256 | A1 | 7/2005 | Natzle | |
| 2005/0208752 | A1 | 9/2005 | Colburn et al. | |
| 2006/0019443 | A1 * | 1/2006 | Kim et al. | 438/243 |
| 2006/0057835 | A1 * | 3/2006 | Anderson et al. | 438/619 |
| 2006/0081830 | A1 * | 4/2006 | Knorr et al. | 257/3 |

OTHER PUBLICATIONS

Notice of Allowance dated Jan. 5, 2009 in U.S. Appl. No. 10/906,267.
Office Action dated Jun. 3, 2008 in U.S. Appl. No. 10/906,267.
Office Action dated Nov. 5, 2007 in U.S. Appl. No. 10/906,267.
Office Action dated Apr. 6, 2007 in U.S. Appl. No. 10/906,267.

\* cited by examiner

*Primary Examiner* — Kathleen Duda
*Assistant Examiner* — Brittany Raymond
(74) *Attorney, Agent, or Firm* — H. Daniel Schnurmann; Roberts Mlotkowski Safran & Cole, P.C.

(57) ABSTRACT

A method of selectively altering material properties of a substrate in one region while making a different alteration of material properties in an adjoining region is provided. The method includes selectively masking a first portion of the substrate during a first exposure and selectively masking a second portion of the substrate during a second exposure. Additionally, a mask may be formed having more than one thickness where each thickness will selectively reduce the amount of energy from a blanket exposure of the substrate thereby allowing a substrate to receive different levels of energy dosage in a single blanket exposure.

16 Claims, 12 Drawing Sheets

METHOD TO CREATE REGION SPECIFIC EXPOSURE IN A LAYER

REFERENCE TO CROSS RELATED APPLICATIONS

This application is related to copending and simultaneously filed U.S. application Ser. No. 10/906,267, which is incorporated herein in its entirety by reference.

FIELD OF THE INVENTION

The invention relates to selectively exposing a substrate of a semiconductor structure, and more particularly to using a UV beam or an e-beam in conjunction with a mask to selectively alter the mechanical, chemical, and/or electrical properties of a substrate.

BACKGROUND DESCRIPTION

In order to form airgaps by an etch back technique, a top surface of a copper (Cu) structure in a SiCOH (silicon, carbon, oxygen and hydrogen) based interlayer dielectric (ILD) is exposed to an oxidizing plasma which is used to damage or alter the surrounding SiCOH. During this process the Cu surface as well as some part of the underlying microstructure of the Cu which is exposed to the plasma can oxidize as an unwanted side effect. Additionally, such an airgap formation process also has the additional need that nanocolumns formed in the processing of the di-block or cap mask not only need to be transferred through the cap material, but also into and through the ILD material followed by the aforementioned oxidizing plasma to damage the material and fabricate an airgap.

One of the problems with transferring these nanocolumns into the cap material and the underlying ILD material is that the transfer mask may not survive the imaging process long enough to ensure a complete etch or patterning of the nanocolumn into the ILD. Further, the etch process itself could become self limiting due to the steep aspect ratios of the nanocolumns penetrating into the ILD material.

Additionally, the mechanical strength of ILDs may decrease with a decreasing dielectric constant (K). This makes chips with a lower K prone to mechanical failure and requires implementation of expensive processes such as laser dicing to prevent such damage. For ILDs that require e-beam and/or UV beam cure, blanket exposures are currently performed with the main parameter of interest being the dielectric constant of the material. As such, the dielectric constant and mechanical properties of a layer in a semiconductor device is at least partly a function of e-beam or UV beam, cure or dosage.

Consequently, for best electrical performance, a dosage that minimizes the dielectric constant is required, whereas for best mechanical strength a dosage that maximizes material properties such as cohesive strength is desired. The dosage values these two different requirements are usually not the same. Hence there is an advantage in being able to do region specific exposures for a given ILD layer with the goal of maximizing electrical performance in one region while also maximizing mechanical strength or certain chemical property in another region.

SUMMARY OF THE INVENTION

In a first aspect of the invention, a method of exposing selective regions of a substrate includes interposing a first blockout mask between a first dose of energy and a first portion of a substrate, and interposing a second blockout mask between a second dose of energy and a second portion of the substrate.

In another aspect of the invention, a method of altering a material properties of a substrate includes forming a first mask over a first region of a substrate, and blanket exposing the substrate with an energy source. The method also includes removing the first mask, and forming a second mask over a second region of the substrate. The method additionally includes blanket exposing the substrate with the energy source.

In another aspect of the invention, a method of selectively conditioning a semiconductor layer includes exposing a first portion of a layer with a first source of energy, and exposing a second portion of the layer with a second source of energy.

In another aspect of the invention, a method of selectively shielding a substrate from an energy beam includes forming a first mask over a first portion of a layer, and forming a second mask over a second portion of the layer. The method also includes blanket radiating the layer with a first source of energy at least once after forming the first blockout mask.

DETAILED DESCRIPTION OF EMBODIMENTS OF THE INVENTION

The invention relates to selectively exposing a substrate of a semiconductor structure using a UV beam or an e-beam to selectively alter the mechanical, chemical, and/or electrical properties of a substrate. In one embodiment, the invention uses e-beam and UV radiation or other beams of energy in conjunction with blocking or blockout masks or masks to selectively damage a SiCOH ILD in selective areas such as, for example, where an air gap is desired. As used herein, "damage" generally refers to altering at least any one of a material's mechanical, chemical or electrical properties.

For example, in one implementation, a portion of a material may be oxidized using an e-beam or a UV beam followed by etching which selects for the altered or oxidized portion of the material. By using a di-block layer and/or a blockout mask, and by exposing the substrate to an e-beam or UV beam, only the areas not covered by the blockout mask are exposed to the radiation. Alternatively, the mask may minimize exposure to radiation. In one aspect, the radiation de-methylates the SiCOH and renders it oxide-like, which may then be removed by an etchant, such as, for example, diluted hydrofluoric acid (DHF).

In the invention, methods are also employed to obtain region specific exposures of a layer. Consequently, region specific exposures for best electrical and mechanical performance may be obtained in an ILD by implementing methods of the invention. For example, a dense wiring region and a kerf region of a semiconductor device are examples of regions where different exposures may be provided in order to optimize electrical performance such as a low K, and mechanical performance (kerf region).

De-methylating a SiCOH layer is one example of altering the properties a semiconductor layer. For example, typically SiCOH materials like BDII (K=2.5-2.7) can be de-methylated to the point that its material properties change from a hydrophobic material (CA>90°) to a hydrophilic material (CA<20°). Such was the result of a severe e-beam exposure between 700 and 900 $\mu C/cm^2$. Even lower exposures could, however, de-methylate enough of the ILD SiCOH to enable faster etching with DHF, compared with unaltered ILD or the optimally cured ILD. Thus, a wide range of e-beam exposures including in the range between 300 and 900 micro $C/cm^2$ are applicable to the invention. For a typical e-beam cure (for example, BDIIx porous SiCOH), which is a compromise between dielectric constant (K) and mechanical properties, a dose of ~150 micro $C/cm^2$ may be used.

UV radiation also results in altering a material's properties such as de-methylation after a sufficiently long e-beam or UV exposure. As an example, BDIIx porous SiCOH exposed to UV rays (broad spectrum microwave mercury (Hg) lamp) for times greater than 30 minutes reduce the methyl content of the ILD substantially. As a result, faster etching with DHF would be possible compared to the unaltered ILD or the optimally cured ILD. Higher irradiance UV lamps can additionally reduce the required exposure time.

Both e-beam and UV beam exposure methods typically benefit from a high substrate temperature for maximum de-methylation while taking into account FEOL material compatibility issues. For example, T=400° C. benefits both e-beam and UV exposures. For a typical UV beam cure (such as BDIIx porous SiCOH), which is a compromise between K and mechanical properties, an exposure of 9 minutes is used. Additionally, T=400° C. is a beneficial temperature for both e-beam and UV exposures.

By using the invention, a full line plus via level air gap can be formed with reduced problems such as incomplete transfer of a nanocolumnar layer to the ILD. Additionally, since only the cap layer needs to be opened, unwanted damage to an adjacent Cu surface is minimized. Moreover, the cap layer is left undamaged by exposure to the ultraviolet (UV) beam or electron beam (e-beam); unlike where creating a damaged layer using a plasma in the SiCOH compromises the oxygen permeability and electromagnetic (EM) resistance of the cap layer.

Figure 1:
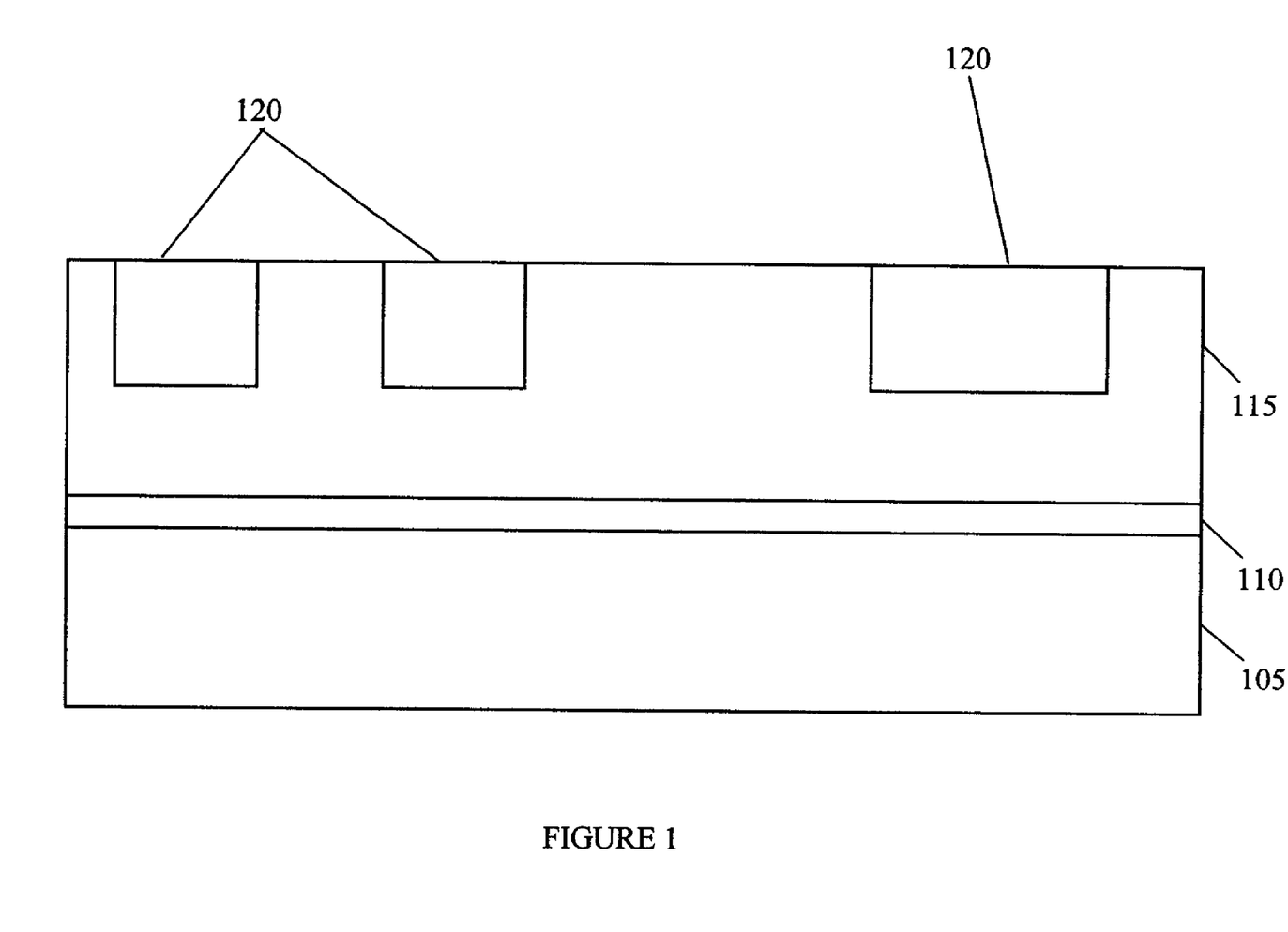
FIG. 1 is an illustration of a step of a beginning structure for creating airgaps in a semiconductor device layer in accordance with the invention.

Referring to FIG. 1, a starting structure for the formation of airgaps includes a silicon layer 105. A gap or intermediate layer 110 is formed on the silicon layer 105, and an interlayer dielectric (ILD) 115 is formed on the intermediate layer 110. The intermediate layer 110 can be any kind of layer which supports the ILD layer 115; whereas, the ILD layer 115 may be any type of dielectric suitable for an ILD layer. For example, in one implementation, the ILD layer 115 may be formed from a mixture of silicon, carbon, oxygen and hydrogen (SiCOH). Additionally, the ILD layer 115 may be formed as a porous ILD in one region and a dense/porous ILD in another region, e.g., the upper level of the ILD layer 115 is a porous ILD. Copper structures 120 are formed in the ILD layer 115. In the illustration of FIG. 1, the ILD layer 115 and the copper structures 120 are planarized, such as, for example by chemical-mechanical polishing (CMP), so that their upper surfaces form a continuous planar surface.

The intermediate layer 110 may be a multi-purpose layer. For example, the intermediate layer 110 may protect the copper structures 120 from being oxidized by placing a oxygen barrier such as a diffusion barrier below the copper structure 120. Layer 110 may also be a protective layer for underlying structures. In other words, the starting structure may include a SiCOH ILD based hardware.

Figure 2:
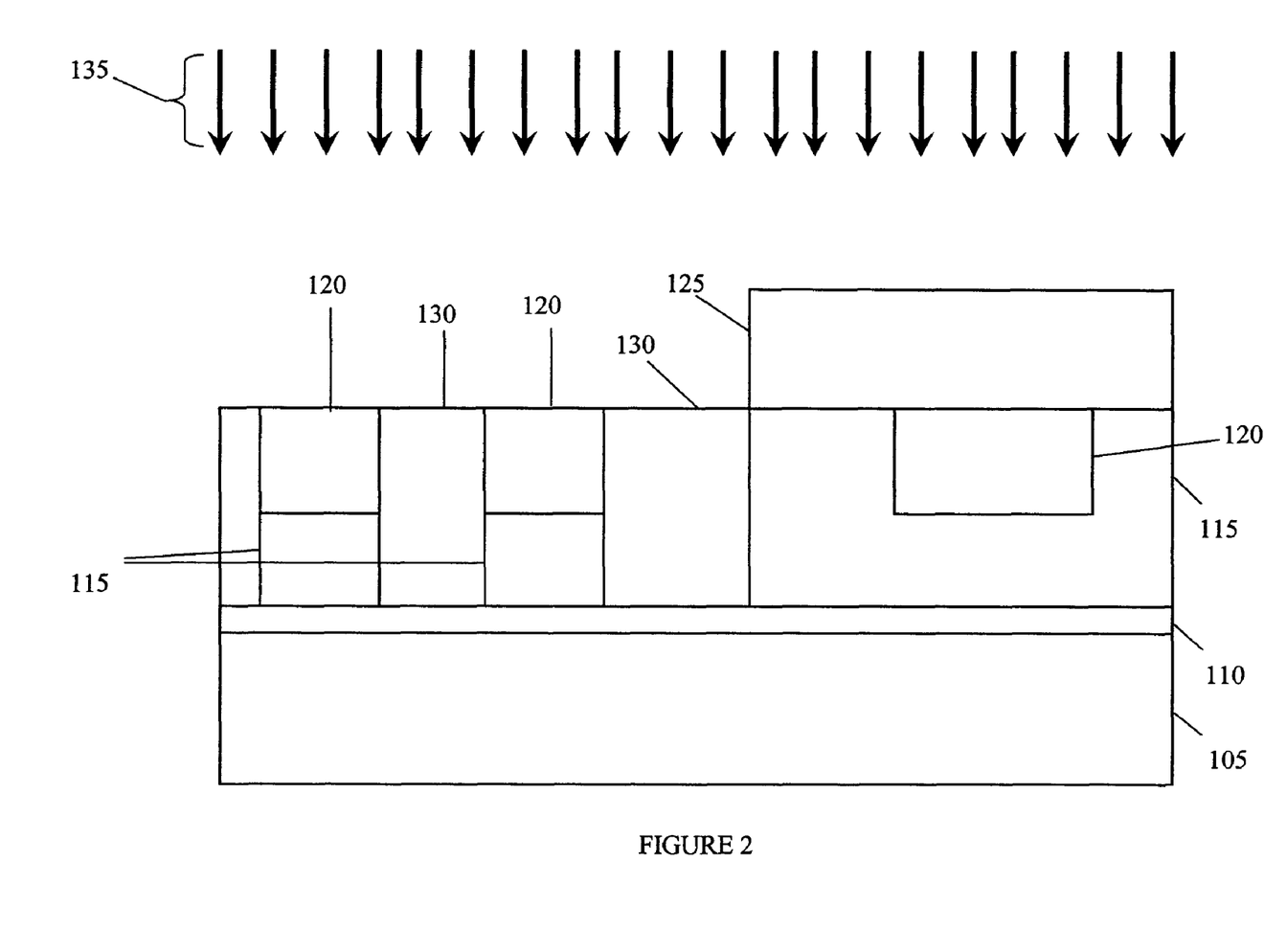
FIG. 2 is an illustration of a step of applying an energy source in accordance with the invention.

Referring to FIG. 2, a mask such as, for example, a blockout mask 125 is formed on a portion of the ILD layer 115. The blockout mask 125 may be formed from any material suitable for masking out either an e-beam or a UV beam or other form of subsequent energy exposure or dosing. In FIG. 2, the blockout mask 125 is positioned over a portion of the ILD layer 115 and on one of the copper structures 120. After the blockout mask 125 is formed, the structure is exposed to a beam 135 of energy. For example, the beam 135 of energy may include an e-beam, an ultraviolet beam, an infrared beam, an ion beam, and an X-ray beam. In one example, the energy source is an e-beam at a dosage of 700 micro $C/cm^2$. It should be noted that time of dosage is relative to dosage amount where the dosage can be performed at a lower intensity for a longer period of time or a higher intensity for a shorter period of time.

It should be noted that any kind of beam of energy may be used for the beam 135 which appropriately alters at least any one of the mechanical, chemical or electrical properties of the ILD layer 115 being exposed to the beam 135. When the structure is exposed to the beam 135, the blockout mask 125, blocks out a corresponding portion of the beam 135 thereby protecting the underlying ILD layer 115 from the beam 135. Additionally, the copper structures 120 also protect the underlying portions of the ILD layer 115 from the beam 135. Accordingly, the protected regions of the ILD layer 115 do not receive energy from the beam 135 and remain substantially unaltered by the beam 135.

In contrast to the protected portions of the ILD layer 115, exposed regions 130 of the ILD layer 115 receive energy from the beam 135. Accordingly, the exposed regions 130 of the ILD layer 115 may have at least any one of its mechanical, chemical or electrical properties altered due to receiving energy from the beam 135. For example, the exposed regions 130 of the ILD layer 115 may be de-methylated or made oxide-like by the beam 135.

In one implementation, the beam 135 alters the molecular structure of the exposed regions 130 and depending on how the structure is altered, determines whether at least any one of the mechanical, chemical or electrical properties of the exposed regions 130 of the ILD layer 115 is altered. In one implementation, de-methylation will occur for regions that are exposed, and regions protected by the Cu will not be modified.

Figure 3:
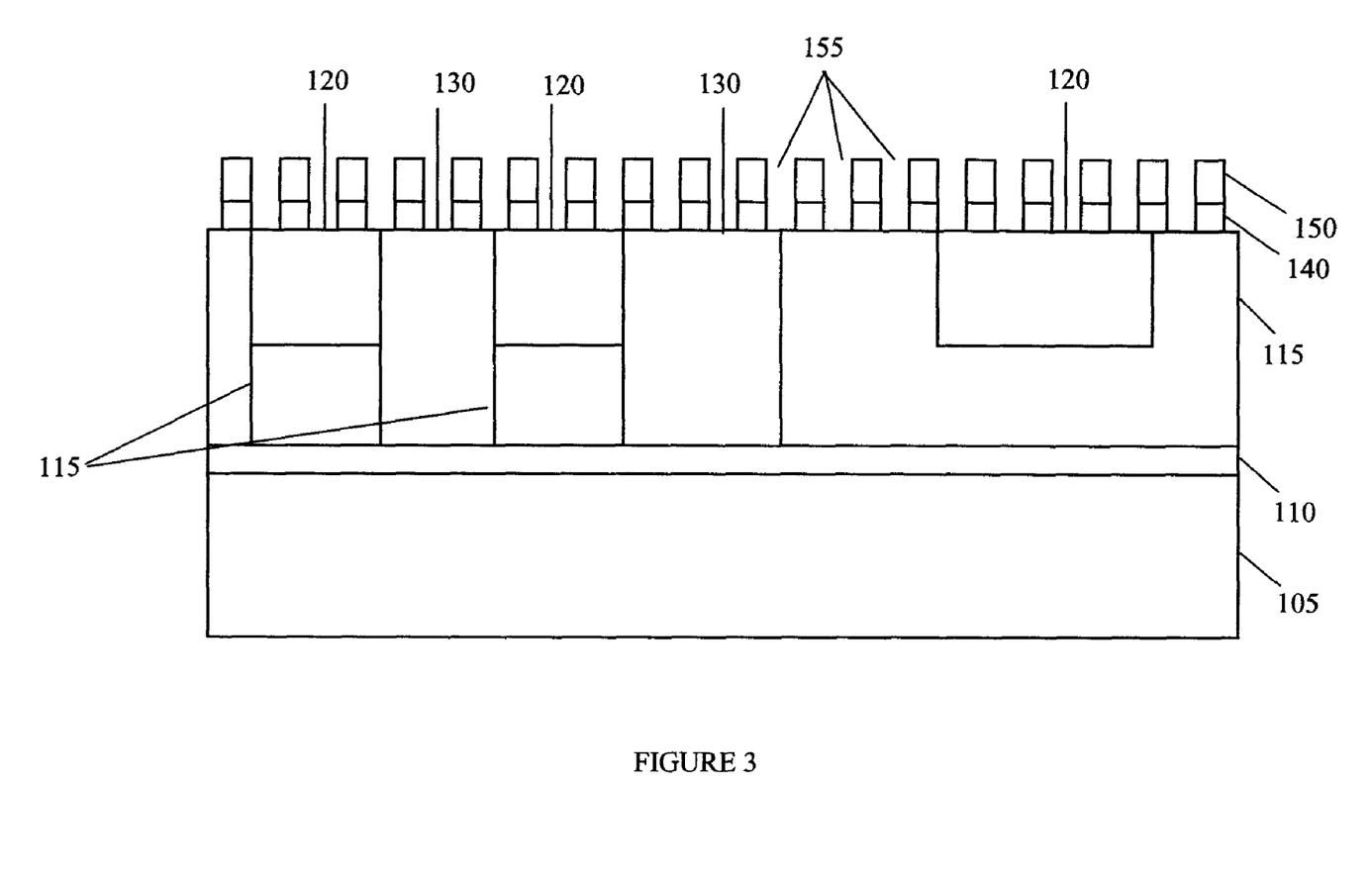
FIG. 3 is an illustration of a step patterning a layer in accordance with the invention.

Referring to FIG. 3, after the exposed regions 130 of the ILD layer 115 receive energy from the beam 135, the blockout mask 125 is removed. Once the blockout mask 125 has been removed, a cap 140 is formed (i.e., a cap is deposited) over the upper surfaces of the ILD layer 115, exposed regions 130 and copper structures 120. The cap 140 may be a $SiN_x$ or $SiC_x$ like material which is deposited by, for example, CVD (chemical vapor deposition). The cap 140 may act as a oxygen barrier, a diffusion barrier and/or a passivation layer.

Once the cap 140 has been formed, a patterning layer 150 is deposited on the cap 140. The patterning layer 150 may be formed from any suitable photo masking material which is compatible for patterning the patterning layer 150. In one example, the height of the patterning layer is about 400 Å. After the patterning layer 150 is deposited, it is patterned to provide a series of perforations or gaps 155 (i.e., a patterning layer is deposited and patterned and etched) through which the exposed capping layer 140 is etched. The etching may be a RIE. The gaps 155 may be, for example, about 20 nm wide and are patterned in the cap 140 and patterning layer 150, across the structure. The gaps 155 will provide access to the selectively exposed portions 130 of the ILD 115.

Figure 3A:
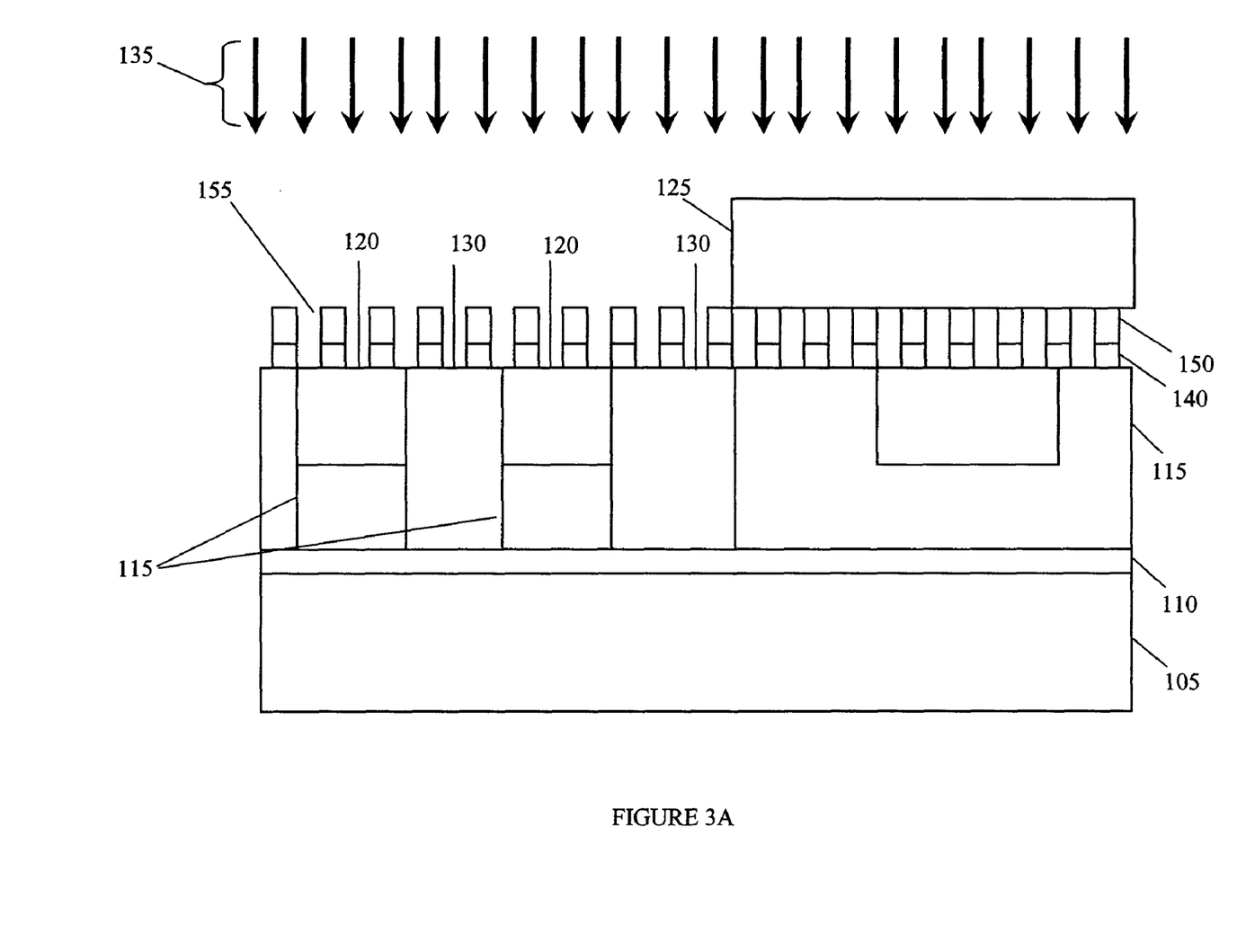
FIG. 3a is an illustration of a step applying an energy source to an exposed patterning layer and underlying structure in accordance with the invention.

Referring to FIG. 3a, in a single slide, shows an alternative process sequence to sequence shown in FIGS. 1, 2 and 3. Essentially the cap layer is deposited and perforations are made in the cap layer. After that the block out mask is deposited subsequent to which the radiation exposure is done. The radiation will demethylate regions 130 which can be extracted out by DHF (as in FIG. 4) after or before blockout mask removal, creating air gaps. In other words, FIG. 3a shows a blockout mask 125 provided over a portion of the patterned structure. The blockout mask 125 may be any known resist material and is used to prevent air gap formation, in later processes. Once the blockout mask 125 is deposited, the structure is blanket exposed to an e-beam or UV energy source. In one example, the energy source is an e-beam at a dosage of about 700 micro $C/cm^2$.

The blockout mask 125 will protect the underlying patterned structure 127 from undergoing any modification during the blanket exposure. By protecting the underlying structure 127, such region will retain its superior mechanical performance while preventing any ILD modifications. On the other hand, the e-beam or UV energy will cure the exposed area 130, including the exposed ILD layer 115. De-methylation will occur in the exposed regions 130 and enhancement of electrical performance of the exposed copper layer 120 may occur. While air-gap formation may be the final goal, other effects such as enhanced electrical performance will happen where demethylated material is removed to create air-gap (k=1). Decreasing K results in better electrical performance. Air-gap typically results in lower possible K (of 1).

Figure 4:
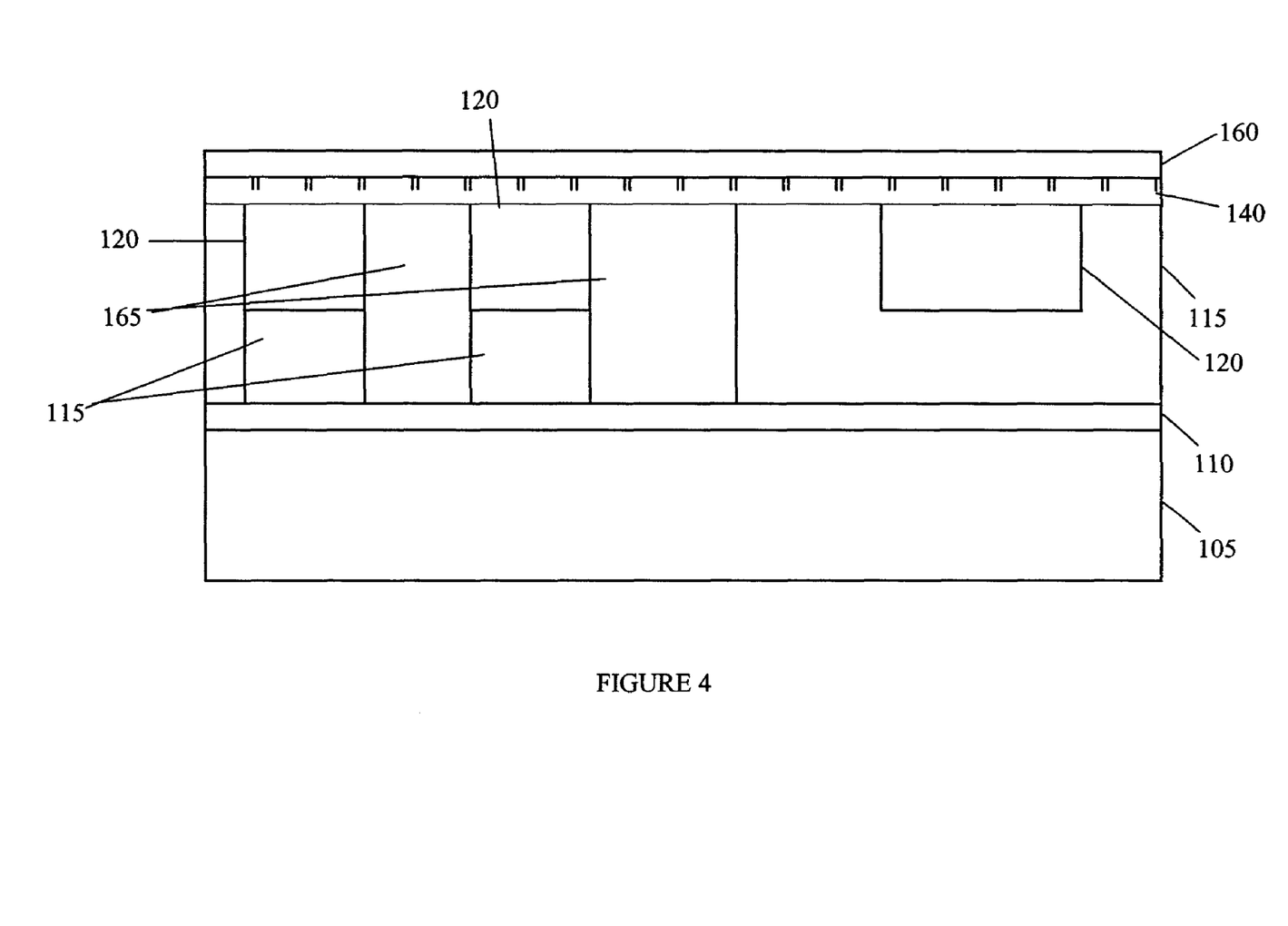
FIG. 4 is an illustration of steps creating airgaps in a semiconductor substrate device layer in accordance with the invention.

In FIG. 4, once the exposed regions 130 of the ILD layer 115 have been removed by a suitable etching process, airgaps 165 or cavities will remain where there were once exposed regions 130 of ILD material. In one aspect, the de-methylated SiCOH ILD is extracted using an appropriate etch to leave behind airgap regions 165. After the airgaps 165 are formed, the cap 140 is either chemically or thermally fused to form a seal or covered with a sealing material 160, such as, for example, N-BLOk. This process will seal the airgaps 165.

Accordingly, as described above, a blockout mask 125 is used to selectively protect an ILD layer 115 during exposure to a beam 135 before a cap 140 is formed. Alternatively, the cap is applied before the exposure. The cap material that is used does not substantially deteriorate on exposure to ebeam/uv. For example, the cap material may not deteriorate because it does not have any methyl groups to start with.

Figure 5:
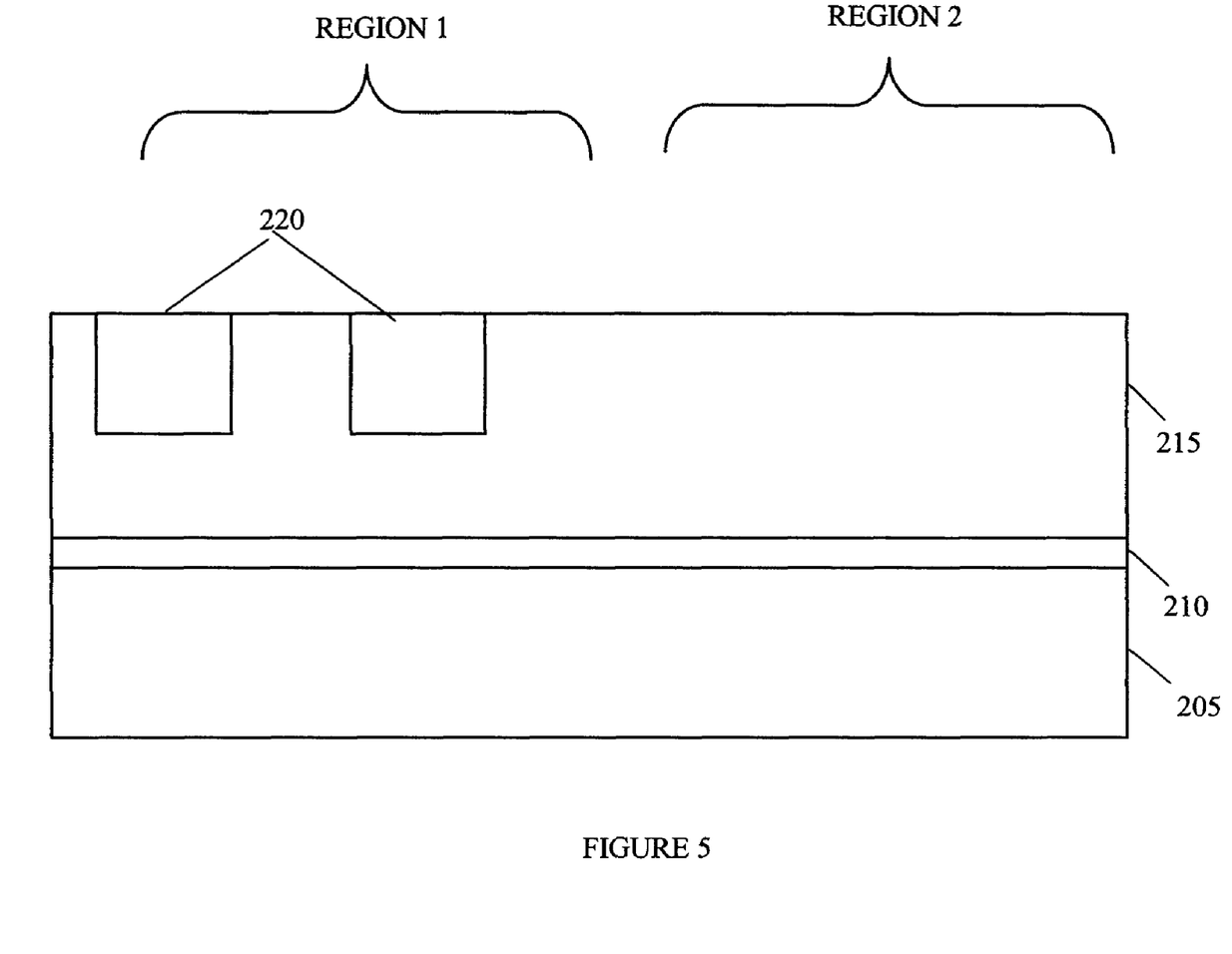
FIG. 5 is an illustration of a step of forming a semiconductor device layer in accordance with the invention.

Referring to FIG. 5, a structure where a portion of the structure is optimized for mechanical properties and another portion of the structure is optimized for electrical properties is shown. The structure includes a silicon substrate 205 with an intermediate layer 210 formed thereon. The intermediate layer 210 may be any kind of layer having certain properties such as a layer acting as a diffusion layer to prevent oxygen from passing there through. The layer may also be a protective layer for the underlying structures. An ILD layer 215 is formed on the intermediate layer 210. The ILD layer 215 may be formed, for example, from SiCOH.

The ILD layer 215 includes copper structures 220 formed therein. The ILD layer 215 and the copper structures 220 have their surfaces planarized so that the surface of the copper structures 220 and the surface of the ILD layer 215 form substantially a planar surface.

The structure of FIG. 5 may be divided into a first region (region 1) and a second region (region 2). For example, region 1 may be a region which will be optimized for electrical performance, such as, for example, a dense wiring area. Region 2 may be a region of the ILD layer 215 which is optimized for mechanical performance such as, for example, a kerf area. In this implementation, region 1 and region 2 may require different ILD properties.

Figure 6:
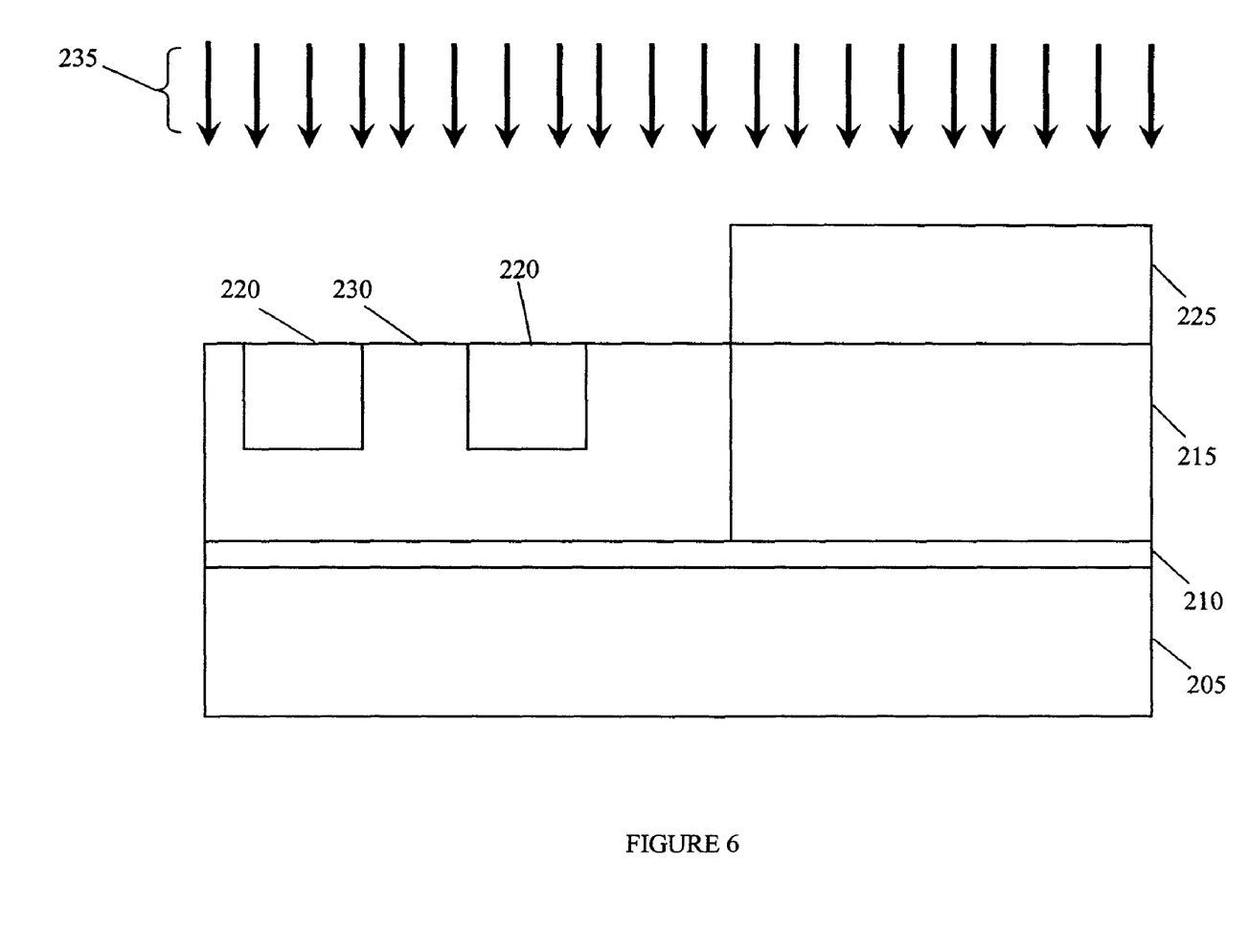
FIG. 6 is an illustration of a step of selectively exposing a semiconductor device layer in accordance with the invention.

Referring to FIG. 6, a blockout mask 225 is formed in region 2 of the ILD layer 215. The blockout mask 225 may be formed of any material suitable for blocking out energy. After the blockout mask 225 is formed, the structure is exposed to a beam 235 of energy. The beam 235 may be, for example, an e-beam, or a UV beam. In one example, the energy source is an e-beam at a dosage of about 100 micro $C/cm^2$.

The beam 235 is a blanket exposure of the entire structure, however, because of the material and thickness of the blockout mask 225, only region 1 receives energy from the beam 235, while the blockout mask 225 blocks energy from the beam 235 from entering the ILD layer 215 in region 2. In one example, the blockout mask 225 is a photoresist material at a thickness of about 300 nm.

Accordingly, the ILD layer 215 of region 1 has its molecular structure altered by energy of the beam 235 to produce a first altered region 230 of the ILD layer 215; whereas, the ILD layer in region 1 remains sufficiently unaltered. In one implementation, the first beam 235 is configured to alter the material of the ILD layer 215 in Region 1 to enhance its electrical performance.

Figure 7:
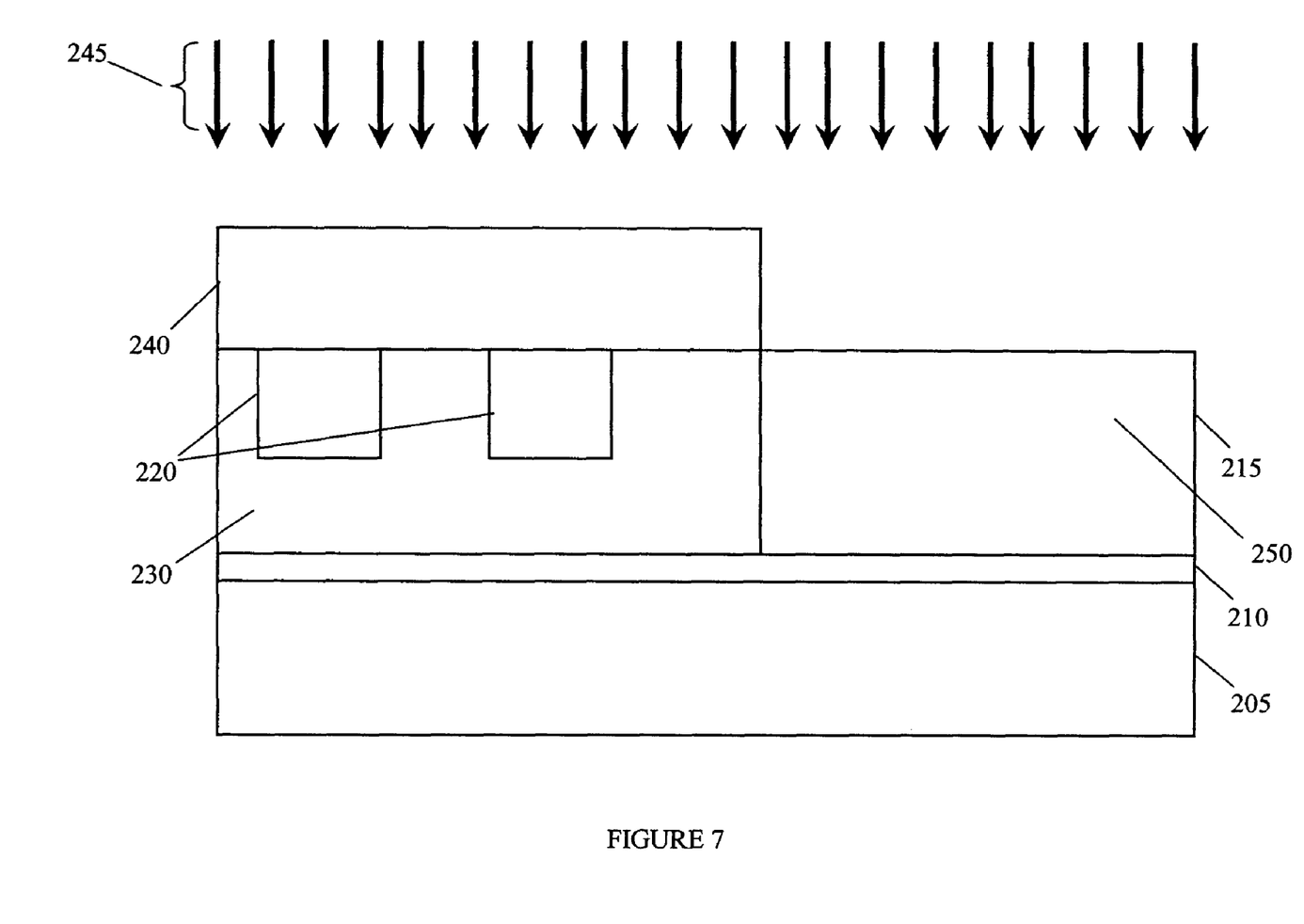
FIG. 7 is an illustration of a step of selectively exposing a semiconductor device layer in accordance with the invention.

Referring to FIG. 7, the first blockout mask 225 is removed and a second blockout mask 240 is formed over the ILD 215 in region 1. In one example, the blockout mask 240 is a photoresist material at a thickness of about 300 nm.

The second blockout mask 240 is configured to protect region 1 of the ILD layer 215 from energy from the second beam 245. Once the blockout mask 240 is in place, a second beam 245 is blanket exposed on to the semi-conductor structure. The second beam 245 may be, for example, a second e-beam or a UV beam. Additionally, the second beam 245 may be a beam having the same type of energy as the first beam 235, but may have a higher or lower dose. In one example, the energy source is an e-beam at a dosage of about 250 micro $C/cm^2$.

Consequently, the molecular structure of the ILD 215 layer in region 2 is altered to produce a second altered region 250 of the ILD layer 215; whereas, the molecular structure of the first altered region 230 of region 1 of the ILD 215 remains as it was after exposure to the first beam 235. In one implementation, the second beam 245 is configured to alter the material of the ILD layer 215 in region 2 to enhance its mechanical performance.

Consequently, multiple blockout masks may be used sequentially in conjunction with multiple beams of selected beam energy and beam type to preferentially alter the molecular structure of predetermined regions of an ILD layer. The molecular structure is selectively altered to enhance certain characteristics in particular regions of the ILD layer. For example, a blockout mask may be placed over a region of a structure to leave exposed a second region of a structure and a beam of energy directed over the entire structure where the beam is configured to enhance or change at least any one of a mechanical, chemical or electrical property of the ILD layer.

Figure 8:
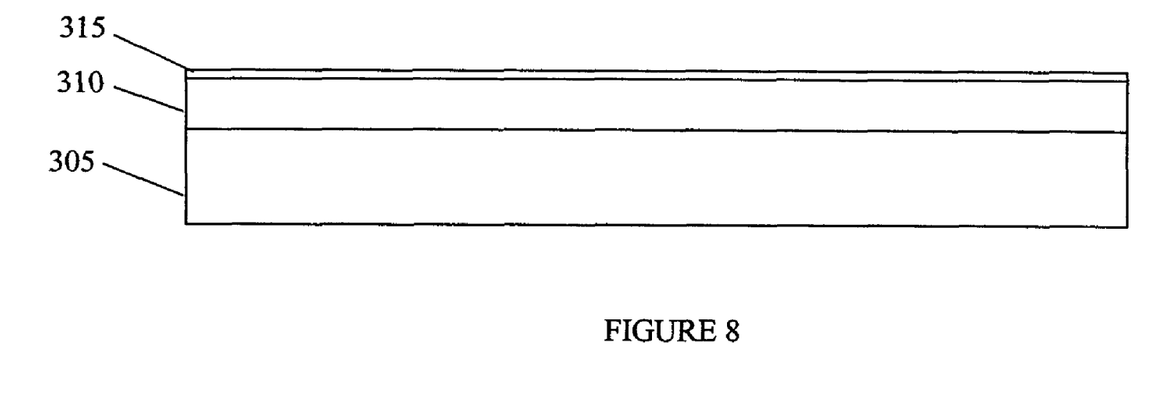
FIG. 8 is an illustration of a step forming layers on semiconductor device layer in accordance with the invention.

Referring to FIG. 8, a structure for exposing different regions of a substrate to different levels of energy simultaneously is shown having a substrate 305. The substrate 305 may be any material suitable for forming a substrate such as silicon. A second layer 310 is formed on of the substrate 305, and may be any material suitable for forming a second layer, such as, for example, a low K material. A first cap 315 is formed on the second layer 310, where the first cap 315 is, for example, a dielectric material. This, in this example, a substrate 305 is provided with a low-K dielectric second layer 310.

Figure 9:
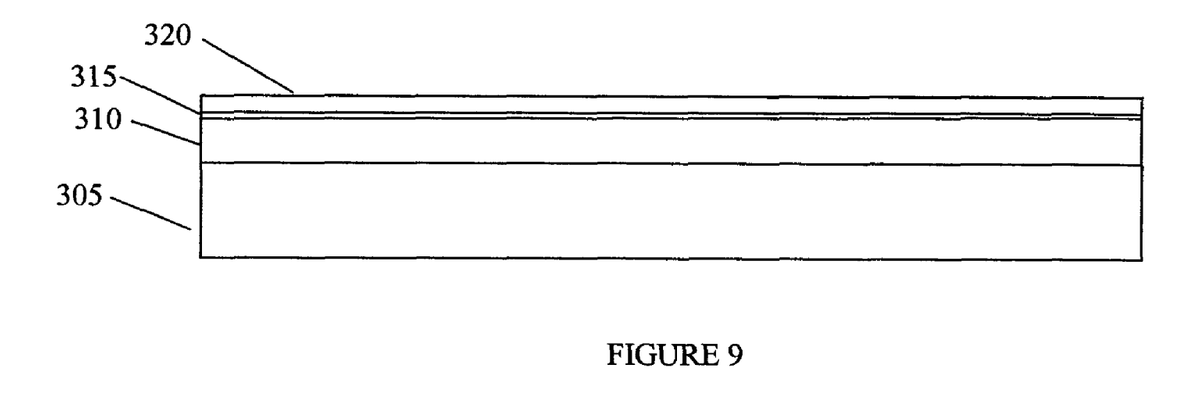
FIG. 9 is an illustration of a step forming layers on a semiconductor device layer in accordance with the invention.

Referring to FIG. 9, a second cap 320 is deposited on the first cap 315. IN this example, the first dielectric cap 315 may be SiNx and the second cap 320 may be TaN. Other materials can be utilized which should evident to those of skill in the art of semiconductor fabrication.

Figure 10:
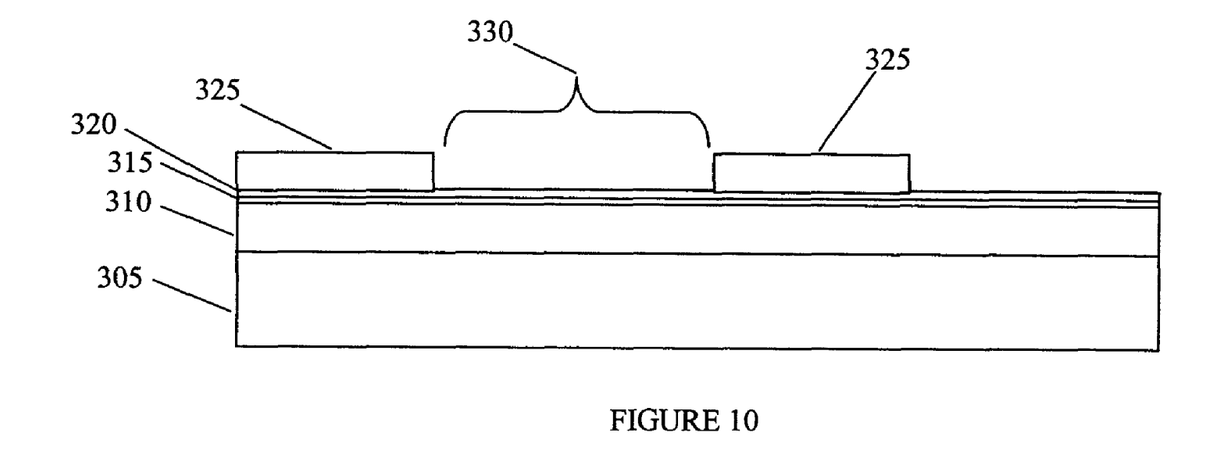
FIG. 10 is an illustration of a step forming a mask on semiconductor device layer in accordance with the invention.

Referring to FIG. 10, a photolithographic mask 325 is formed on the second cap 320. After formation, the photolithographic mask 325 is patterned to form an etching mask for the second cap 320. In this manner, the photolithographic mask 325 will have a first gap 330 formed therein.

Figure 11:
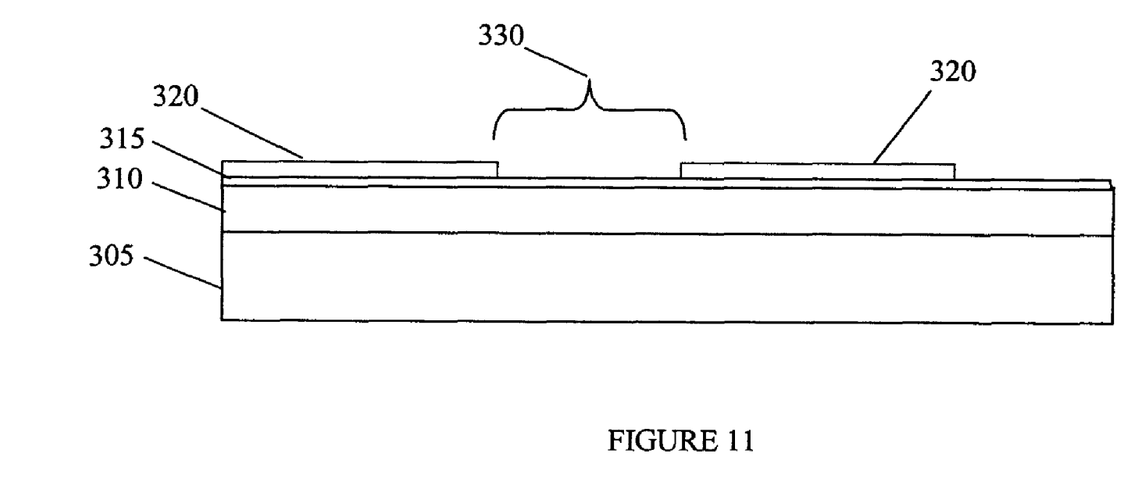
FIG. 11 is an illustration of a step of selectively etching regions in a semiconductor device layer in accordance with the invention.

Referring to FIG. 11, a portion of the exposed second cap 320 is removed in the region of the first gap 330 through an etching processing, such as, for example, RIE. In this process, the first mask 325 is removed to expose portions of the second cap 320. Thus, the second cap 320 is etched exposing the first cap 315 in selected areas. It should be noted that the photolithographic mask 325 could also be opened in selected areas which is not necessarily the same areas as the second cap 320.

Figure 12:
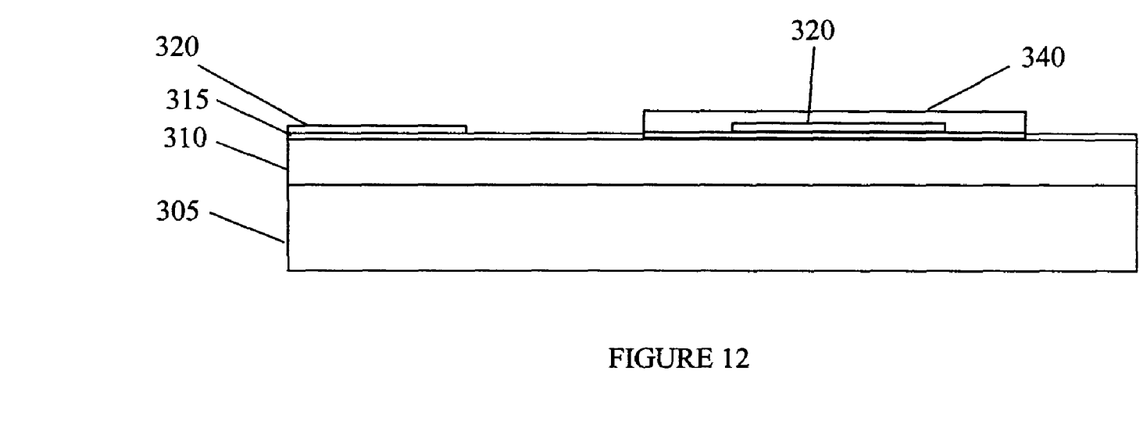
FIG. 12 is an illustration of a step of building a layer in a semiconductor device layer in accordance with the invention.

Referring to FIG. 12, a second mask 340 is formed over a portion of the structure. Thus, an additional mask could be applied to further mask off areas.

Figure 13:
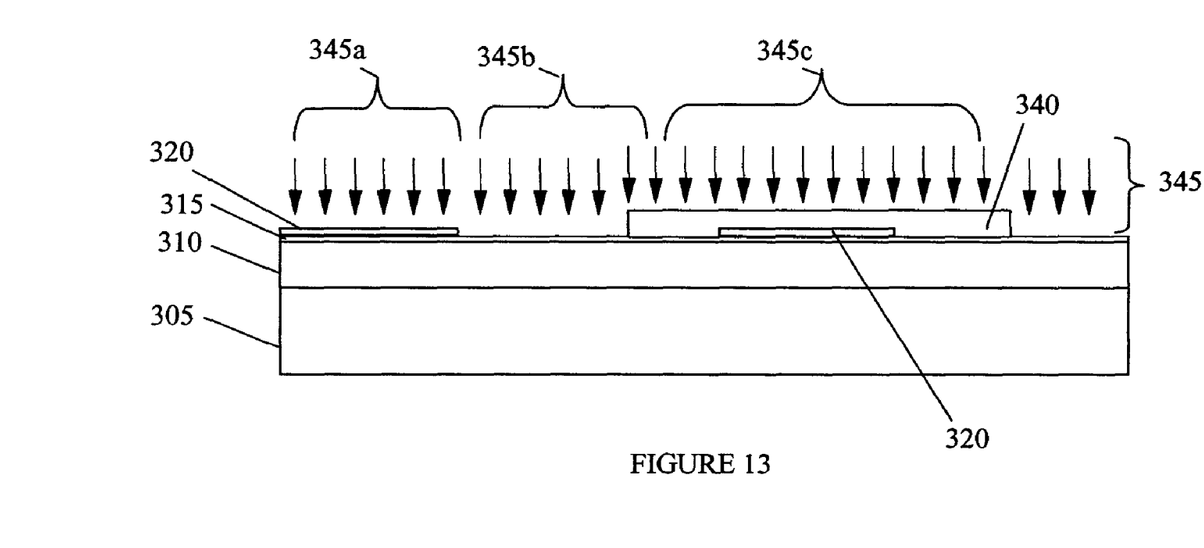
FIG. 13 is an illustration of a step in selectively exposing a semiconductor device layer in accordance with the invention.

Referring to FIG. 13, after the second mask 340 is formed, the entire structure is blanked exposed to a beam of energy. A beam of energy may include, for example, a e-beam or a UV beam. In one example, the energy source is an e-beam at a dosage of about 250 micro C/cm².

Due to the different formation of the first cap 315, the second cap 320 and mask 340, different amounts of energy 345a, 345b and 345c are absorbed before reaching the second layer 310. Accordingly, where the second layer 310 is a material which has its molecular structure altered in different ways by different amounts of the beam 345, a single blanket exposure will have different effects in the various regions of the second layer 310. Accordingly, it is possible to optimize various regions for at least any one of a mechanical, chemical or electrical property with a single blanket beam 345.

The thickness of the blackout mask depends on the density of the mask material and on the thickness of the ILD that is exposed assuming the dose should reach the bottom of the ILD. For example, if ILD thickness is 300 nm and its density is 1.3 g/cm³, an electron energy of 3.4 KeV may be used. A mask with similar density should be about 300-400 nm to prevent substantially all electrons from reaching the underlying layer.

Figure 14:
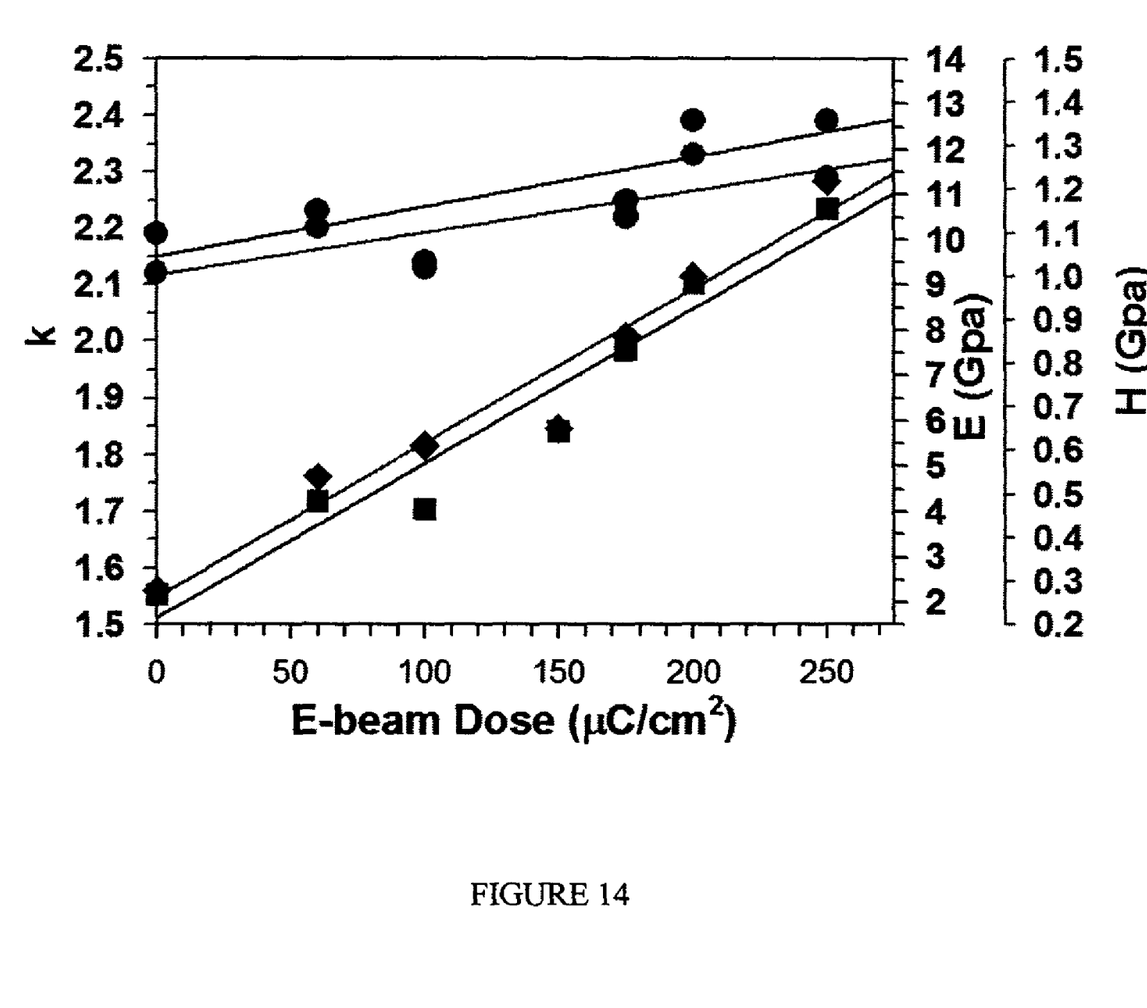
FIG. 14 is a graph of examples of electrical and mechanical performance of an ILD exposed in accordance with the invention.

Referring to FIG. 14, an example of different energy doses in accordance with the invention is shown. These doses can be used to provide improved electrical and mechanical performance. In FIG. 14, the X axis shows e-beam dose in micro C/cm². The left axis shows dielectric constant K, and the right Y axis shows elastic modulus (E) in GigaPascals (GPa) and also shows hardness (H) in GPa.

The circular data points and the line labeled "A" show values for K at 23° C. and a best fit to those data values, respectively. The triangular data points and line "B" show values of dielectric constant (K) at 150° C., and a best fit to those data values, respectively. The diamond data points and the line labeled "C" show values of H in GPa and a best fit to those data values, respectively. The square data points and the line labeled "D" show values of E in GPa and a best fit to those data values, respectively for an methyl silsesquioxane (MSQ) based ILD.

FIG. 14 shows that mechanical properties of the ILD increase with increasing dose and that the improvement in mechanical properties occurs at a faster rate than a resulting increase in K. However, K achieves its best value at a dose of about 100 micro C/cm² (where k=2.1) while above 200 micro C/cm² K becomes larger than 2.3. Accordingly an e-beam dose of about 100 μC/cm² may be used in the wiring regions (E=4.1 GPa) and about 250 micro C/cm² in the kerf region of the ILD (E=10.7 GPa). Consequently, as FIG. 14 shows, it is not possible to maximize both the electrical performance (decrease K) and mechanical performance with blanket exposures due to the different dosage requirements.

While the invention has been described in terms of exemplary embodiments, those skilled in the art will recognize that the invention can be practiced with modifications and in the spirit and scope of the appended claims.

What is claimed is:

1. A method of exposing selective regions of a substrate, comprising the steps of:
    interposing a first blockout mask between a first dose of energy and a first portion of a substrate;
    interposing a second blockout mask between a second dose of energy and a second portion of the substrate, the first blockout mask being a different thickness than the second blockout mask, wherein:
    providing the first dose of energy comprises exposing the substrate to the first energy dose;
    providing the second dose of energy comprises exposing the substrate to the second energy dose;
    the first dose of energy alters a dielectric strength of the second portion of the substrate, and the second dose of energy alters a mechanical constant of the first portion of the substrate;
    the first dose of energy and the second dose of energy comprise any one of at least an electron beam, an ion beam, an ultraviolet beam, an infrared beam, and an x-ray beam;
    the first blockout mask comprises a first material and the second blockout mask comprises a second material, which is different from the first material and absent in the first blockout mask;
    the substrate comprises an interlayer dielectric (ILD) and the ILD includes copper structures;
    the second portion of the substrate is a first region of the ILD that includes the copper structures and the first portion of the substrate is a second region of the ILD that is devoid of the copper structures; and the first blockout mask is configured to protect the second region of the ILD from energy from the first dose of energy and the second blockout mask is configured to protect the first region of the ILD from energy from the second dose of energy.

2. The method of claim 1, wherein the first dose of energy comprises a first type of energy and the second dose of energy comprises a second type of energy.

3. The method of claim 1, wherein the first dose of energy comprises a first amount of energy and the second dose of energy comprises a second amount of energy.

4. The method of claim 1, wherein the interposing steps comprise forming separate blockout masks over the substrate.

5. The method of claim 1, wherein the second region of the ILD remains substantially unaltered after the providing the first dose of energy.

6. The method of claim 5, wherein after the providing the second dose of energy the first region of the ILD remains substantially the same as the first region was after the providing the first dose of energy.

7. A method of selectively conditioning a semiconductor layer, comprising the steps of:
exposing a first portion of the layer through a first blockout mask with a first source of energy; and
exposing a second portion of the layer through a second blockout mask with a second source of energy,
wherein:
the first blockout mask comprises a first material and the second blockout mask comprises a second material, which is different from the first material and absent in the first blockout mask;
the first source of energy alters a dielectric strength of the second portion of the layer, and the second source of energy alters a mechanical constant of the first portion of the layer;
the layer comprises an interlayer dielectric (ILD) and the ILD includes copper structures;
the second portion of the layer is a first region of the ILD that includes the copper structures and the first portion of the layer is a second region of the ILD that is devoid of the copper structures; and
the first blockout mask is configured to protect the second region of the ILD from energy from the first source of energy and the second blockout mask is configured to protect the first region of the ILD from energy from the second source of energy.

8. The method of claim 7, further comprises forming the first blockout mask over the second portion of the layer, and exposing the first portion with the first energy source.

9. The method of claim 8, wherein forming the first blockout mask over the second portion of the layer and forming the second blockout mask over the first portion of the layer comprises forming a single blockout mask of multiple thicknesses.

10. The method of claim 7, wherein the first source of energy and the second source of energy comprises any one of at least an electron beam, an ion beam, an ultraviolet beam, an infrared beam, and an x-ray beam.

11. A method of selectively shielding a substrate from an energy beam, comprising the steps of:
forming a first mask over a first portion of a layer;
forming a second mask over a second portion of the layer; and radiating the layer with a first source of energy at least once after forming the first mask; and
radiating the layer with a second source of energy,
wherein:
the first source of energy comprises a first type of energy and the second source of energy comprises a second type of energy different from the first type of energy,
the first source of energy and the second source of energy comprises any one of at least an electron beam, an ion beam, an ultraviolet beam, an infrared beam, and an x-ray beam,
the first source of energy alters a dielectric strength of the second portion of the layer, and the second source of energy alters a mechanical constant of the first portion of the layer;
the layer comprises an interlayer dielectric (ILD) and the ILD includes copper structures;
the second portion of the layer is a first region of the ILD that includes the copper structures and the first portion of the layer is a second region of the ILD that is devoid of the copper structures; and
the first mask is configured to protect the second region of the ILD from energy from the first source of energy and the second mask is configured to protect the first region of the ILD from energy from the second source of energy.

12. The method of claim 11, wherein the forming the first mask is a blockout mask over the first portion of the layer and the forming the second mask is a blockout mask over the second portion of the layer.

13. A method of altering a material properties of a substrate, comprising the steps of:
forming a first capping layer on a substrate;
forming a second capping layer on the first capping layer;
forming a first mask over a first region of the substrate;
forming a gap in the first mask;
forming a gap in the second capping layer through the gap formed in the first mask by etching the capping layer while removing the first mask to expose a portion of the first capping layer;
forming a second mask over a portion of the second capping layer; and
exposing the substrate with an energy source in a single exposing process, resulting in subjecting the substrate to at least a first concentration of energy and a second concentration of energy dependent on material thickness of the first capping layer, the second capping layer and the second mask,
wherein the first concentration of energy alters a mechanical strength of a first portion of the substrate, and the second concentration of energy alters a dielectric constant of a second portion of the substrate.

14. The method of claim 13, wherein the first concentration of energy comprises a first amount of energy and the second concentration of energy comprises a second amount of energy.

15. The method of claim 13, wherein the energy source comprises any one of at least an electron beam, an ion beam, an ultraviolet beam, an infrared beam, and an x-ray beam.

16. The method of claim 13, wherein the first mask is a first blockout mask of a first material and the second mask is a second blockout mask of a second material, which is different from the first material and absent in the first blockout mask.

* * * * *